(12) United States Patent
Wu et al.

(10) Patent No.: US 10,374,076 B2
(45) Date of Patent: Aug. 6, 2019

(54) SHIELD INDENT TRENCH TERMINATION FOR SHIELDED GATE MOSFETS

(71) Applicant: SEMICONDUCTOR COMPONENTS INDUSTRIES, LLC, Phoenix, AZ (US)

(72) Inventors: Xiaoli Wu, Shanghai (CN); Joseph Yedinak, Mountain Top, PA (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 15/639,961

(22) Filed: Jun. 30, 2017

(65) Prior Publication Data

US 2019/0006512 A1    Jan. 3, 2019

(51) Int. Cl.
*H01L 29/78* (2006.01)
*H01L 29/40* (2006.01)
*H01L 29/06* (2006.01)
*H01L 29/41* (2006.01)

(52) U.S. Cl.
CPC ...... *H01L 29/7811* (2013.01); *H01L 29/0684* (2013.01); *H01L 29/407* (2013.01); *H01L 29/41* (2013.01); *H01L 29/7813* (2013.01)

(58) Field of Classification Search
CPC ............. H01L 29/7811; H01L 29/0684; H01L 29/7813; H01L 29/407
See application file for complete search history.

(56) References Cited

U.S. PATENT DOCUMENTS

| 6,724,042 | B2 | 4/2004 | Onishi et al. |
| 7,397,083 | B2 | 7/2008 | Amali et al. |
| 8,304,829 | B2 | 11/2012 | Yedinak et al. |
| 2005/0017293 | A1 | 1/2005 | Zundel et al. |
| 2005/0116313 | A1 | 6/2005 | Lee et al. |
| 2005/0167742 | A1* | 8/2005 | Challa .................. H01L 21/3065 257/328 |
| 2007/0138543 | A1 | 6/2007 | Saito |
| 2014/0015039 | A1* | 1/2014 | Hossain .................. H01L 29/36 257/330 |
| 2014/0273374 | A1* | 9/2014 | Yedinak ............ H01L 29/66727 438/272 |

FOREIGN PATENT DOCUMENTS

WO    2005065385 A2    7/2005

* cited by examiner

*Primary Examiner* — Allen L Parker
*Assistant Examiner* — Gustavo G Ramallo
(74) *Attorney, Agent, or Firm* — Brake Hughes Bellermann LLP

(57) ABSTRACT

In a general aspect, a power semiconductor device can include a semiconductor region having an active region and a termination region. The device can also include a plurality of trench shield electrodes each having a first portion disposed in the active region and a second portion disposed in the termination region. One or more of the trench shield electrodes can have a second portion that extends a first distance into the termination region, while one or more other trench shield electrodes can have a second portion that extends a second distance into the termination region, the second distance being less than the first distance. The trench shield electrode(s) having the second portion that extends the second distance into the termination region can be interleaved with the trench shield electrode(s) having the second portion that extends the first distance into the termination region.

13 Claims, 8 Drawing Sheets

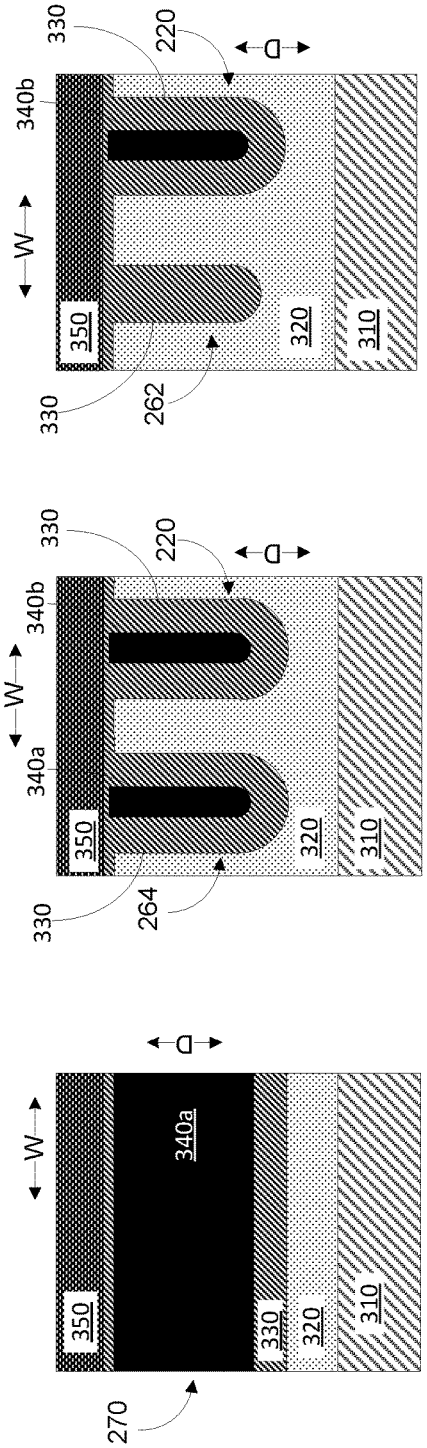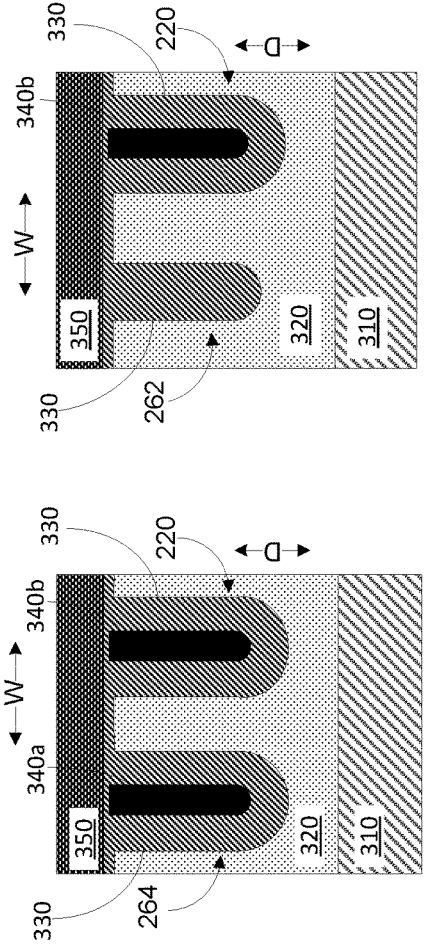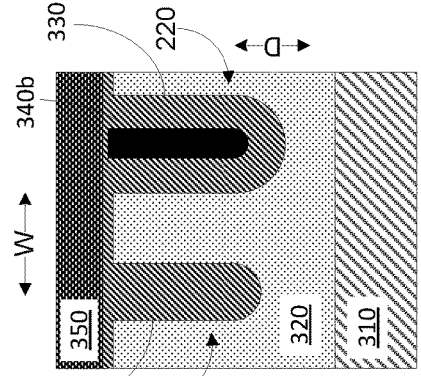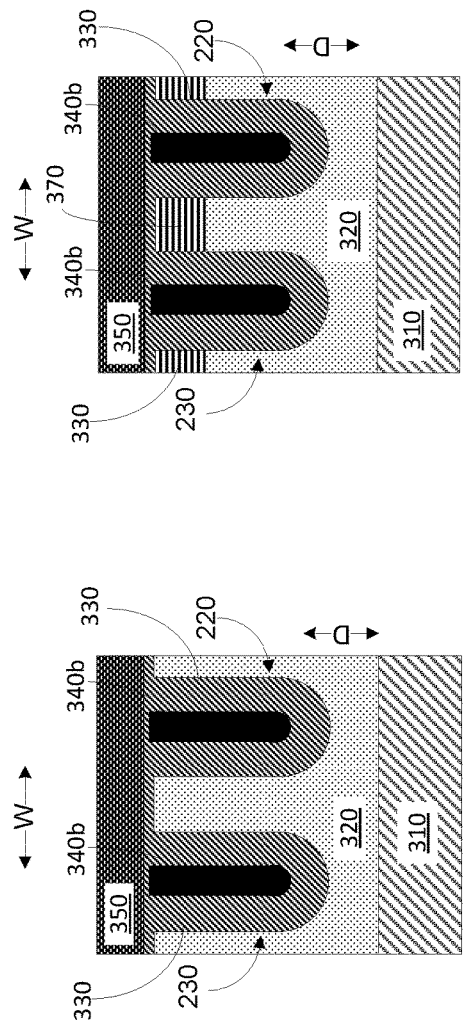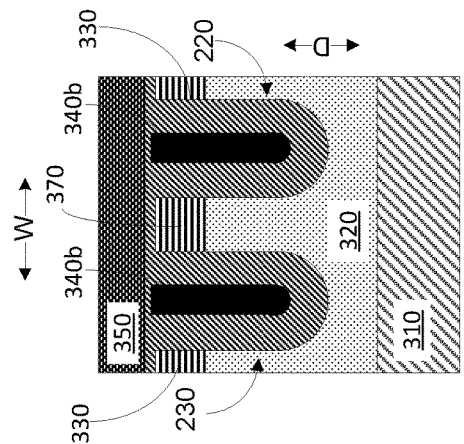

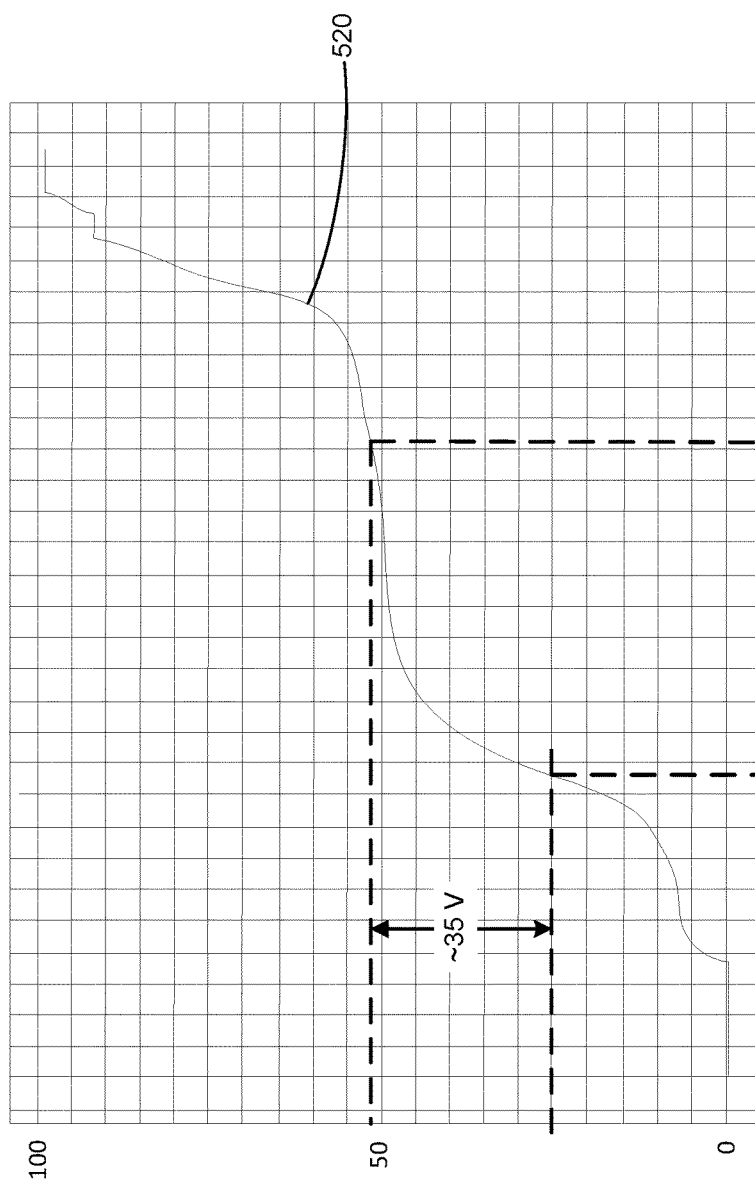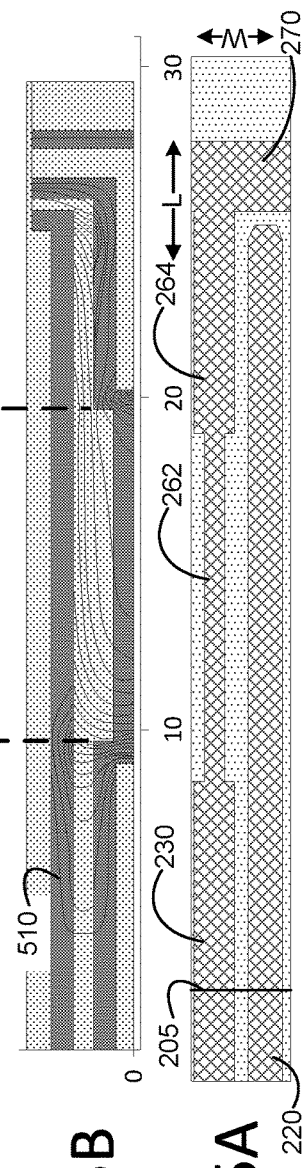
FIG. 5C
FIG. 5B
FIG. 5A

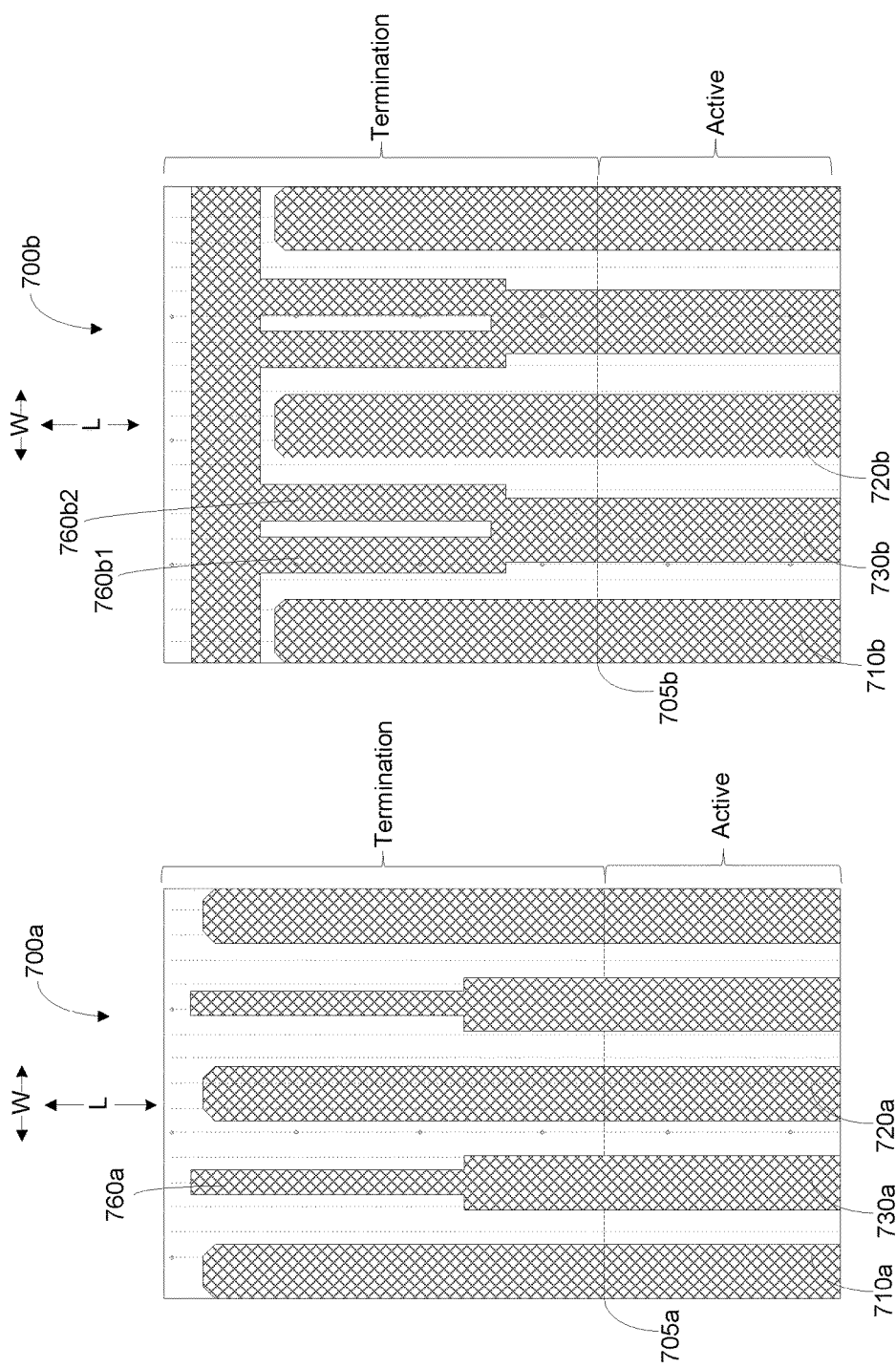

SHIELD INDENT TRENCH TERMINATION FOR SHIELDED GATE MOSFETS

TECHNICAL FIELD

This description relates to power semiconductor devices. More specifically, this description relates to termination structures with indented shield electrodes for power semiconductor devices, such as shielded trench gate metal-oxide semiconductor field-effect transistors (MOSFETs).

SUMMARY

In a general aspect, a power semiconductor device can include a semiconductor region having an active region and a termination region. The device can also include a first trench shield electrode defined in the semiconductor region. The first trench shield electrode can extend along a longitudinal axis. The first trench shield electrode can have a first portion disposed in the active region and a second portion disposed in the termination region. The second portion of the first trench shield electrode can extend, along the longitudinal axis, a first distance into the termination region from the active region. The device can further include a second trench shield electrode defined in the semiconductor region. The second trench shield electrode can extend along the longitudinal axis in parallel with the first trench shield electrode. The second trench shield electrode can have a first portion disposed in the active region and a second portion disposed in the termination region. The second portion of the second trench shield electrode can extend, along the longitudinal axis, the first distance into the termination region from the active region. The device can also further include a third trench shield electrode defined in the semiconductor region between the first trench shield electrode and the second trench shield electrode. The third trench shield electrode can extend along the longitudinal axis in parallel with the first trench shield electrode and the second trench shield electrode. The third trench shield electrode can have a first portion disposed in the active region and a second portion disposed in the termination region. The second portion of the third trench shield electrode can extend, along the longitudinal axis, a second distance into the termination region from the active region, the second distance being less than the first distance.

BRIEF DESCRIPTION OF THE DRAWINGS

FIGS. 4A-4E are diagrams illustrating cross-sectional views of the termination structure of FIG. 2 along respective cut lines shown in FIG. 2.

FIGS. 5A-C are diagrams illustrating simulation results for the termination structure illustrated in FIG. 2.

FIGS. 7A-7D are diagrams illustrating termination structures with indented shield electrodes that can be implemented in power semiconductor devices, according to various implementations.

Figure 1:
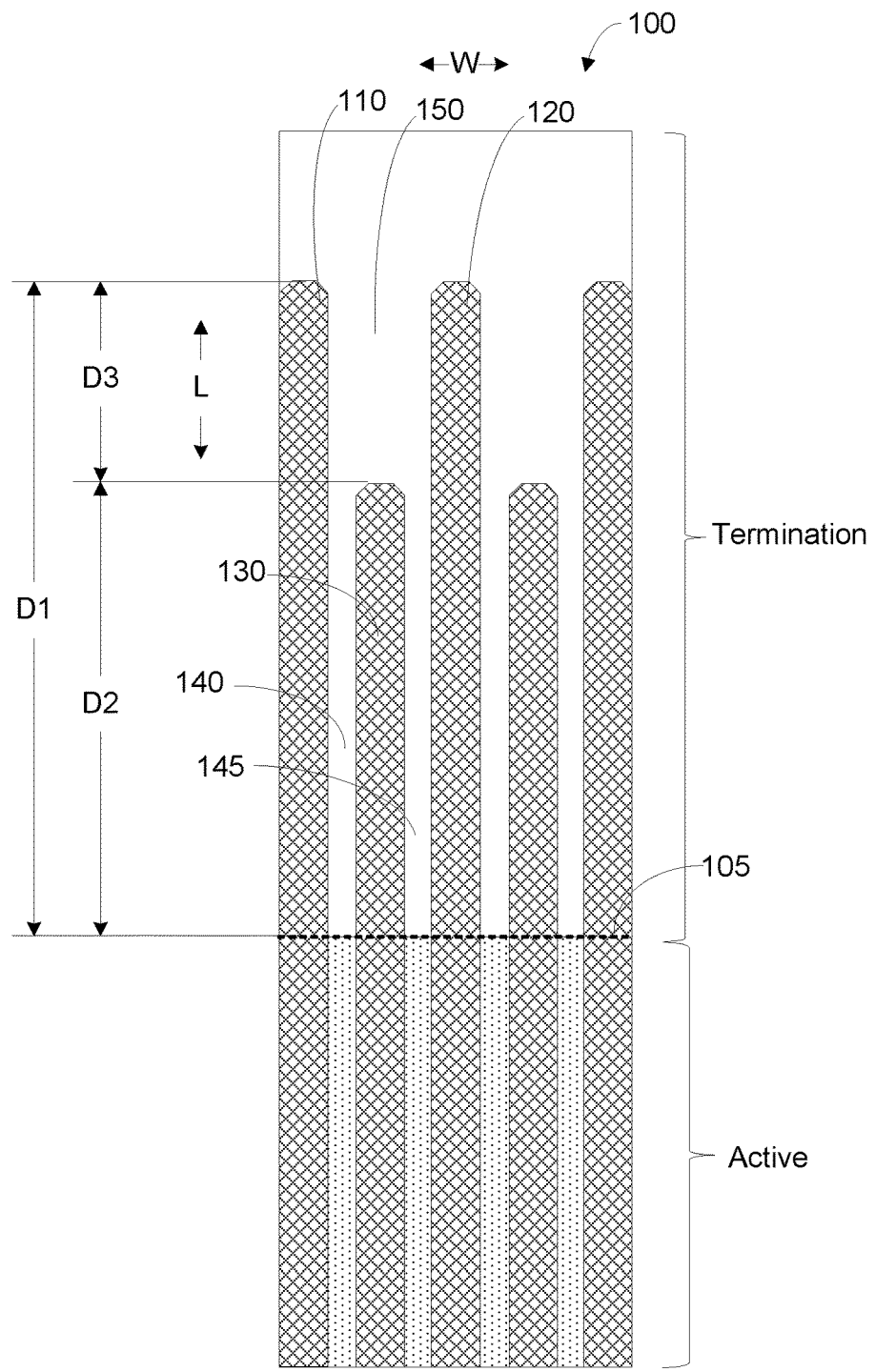
FIG. 1 is a diagram illustrating a plan view of a termination structure with indented shield electrodes that can be implemented in a power semiconductor device, according to an implementation.

In the drawings, like reference symbols in the various drawings indicate like elements. Reference numbers for some like elements may not be repeated for all such elements. In certain instances, different reference numbers may be used for like elements, or similar elements. Some reference numbers for certain elements of a given implementation may not be repeated in each drawing corresponding with that implementation. Some reference numbers for certain elements of a given implementation may be repeated in other drawings corresponding with that implementation, but may not be specially discussed with reference to each corresponding drawing.

DETAILED DESCRIPTION

Power semiconductor devices (also can be referred to as power devices), such as shielded trench gate metal-oxide semiconductor field-effect transistors (MOSFETs), can be implemented in a semiconductor die. For instance, a semiconductor die can have an active area (active region, etc.) where an array of semiconductor mesas and trenches that implement a given power device are located. For example, trenches formed in a semiconductor region can define the corresponding semiconductor mesas. Gate electrodes and/or shield electrodes can be formed in the trenches, while other elements of the power device (e.g., a body region, source regions, heavy body regions, etc.) can be defined in the mesas, e.g., between the trenches.

The semiconductor die can also include a termination area (e.g., field termination area, termination region, etc.) that is disposed around or adjacent to (e.g., completely surrounds, partially surrounds, borders, etc.) the active area. The termination region can be used to minimize electric fields around the active area, and may not be configured to conduct current during operation of the power semiconductor device implemented in the active region. In certain implementations, trenches from the active region can extend into the termination region to form, at least in part, a termination structure. In the termination region, the trenches can include, for example, shield electrodes formed in the trenches that are electrically coupled to a potential of the power device (e.g. a source potential of a power MOSFET) or, in some implementations can be floating.

While a breakdown voltage (e.g., holding voltage, voltage rating) of a power device can be determined by voltage breakdown processes that occur within the active region, various breakdown processes can occur in the termination region that can significantly lower a breakdown voltage for an associated power device. For example, differences in charge balance (e.g. a large imbalance between available charge at a surface of a mesa in the termination region and available charge at a bottom of the mesa in the termination region) can affect such breakdown voltages. For instance, if an amount of available charge at a surface of a mesa is significantly less (e.g., by an order of magnitude or more) than an amount of available charge at the bottom of the mesa, this charge imbalance can result in rapid depletion of the termination region at the mesa surface when an associated power device is in an off-state. This rapid depletion can cause a depletion field from the active area to extend beyond the termination structure (e.g., beyond the ends of shield electrode filled trenches in the termination region) at a voltage below a desired breakdown voltage, which can result in a breakdown process occurring in the termination region and, therefore, reduce a breakdown voltage (holding voltage) of the associated power device below a desired breakdown voltage.

A number of factors can affect charge balance in such power devices. For instance, certain design features and processing characteristics that are implemented to improve device performance can effect charge balance (e.g., in the termination region). For example, spacing between trenches (which results in reduced mesa widths) and/or retrograde doping in a semiconductor region in which the trenches and mesas are defined can increase such charge imbalance. Use of a retrograde doped semiconductor material (e.g., an epitaxial silicon layer) results in associated mesas having lower doping in their upper portions than at the bottoms of the mesas). Further, formation of trenches with sloped sidewalls produces mesas that are narrower at their tops than at their bottoms. This variation in width between the tops of the mesas and the bottoms of the mesas can further increase charge imbalance from the upper portions of the mesas to the lower portions of the mesas. Use of termination structures that include indented (also can be referred to as shortened or truncated) trench shield electrodes, such as those described herein, can compensate for such charge imbalance and increase an electric (depletion) field potential that can be sustained by the termination region, which can prevent the depletion field from extending beyond the termination trenches and causing a breakdown process to occur below a desired breakdown voltage of an associated power device.

FIG. 1 is a diagram that illustrates a plan view of an example termination structure 100 for a power semiconductor device, according to an implementation. FIG. 1 illustrates only a portion of the termination structure 100 that can be used in a semiconductor die including a power device, such as a shielded gate MOSFET. As shown in FIG. 1, the termination structure 100 can extend between an active region and a termination region. An edge 105 of a well region (e.g., a p-well for an n-type MOSFET) that acts as a body region of the power device can define a boundary between the active region and the termination region. In implementations, a termination region that is implemented using the termination structure 100 can be disposed around (e.g., surround, partially surround, border, etc.) a corresponding active region in which a power device is implemented.

The termination structure 100 can include a plurality of termination shield trenches that extend along a longitudinal axis L. The termination shield trenches can have a portion disposed in an active region (e.g., active portion) and a portion disposed in a termination region (e.g., a termination portion). The plurality of termination shield trenches can include termination shield trenches 110 and 120 (which, for purposes of this discussion, can be referred to as standard termination shield trenches) and a plurality of shortened (indented) termination shield trenches, such as termination shield trench 130. As shown in FIG. 1, each of the termination shield trenches 110, 120 and 130 extend along the longitudinal axis L, and in parallel with one another. In implementations, a termination structure can alternate standard termination shield trenches with indented termination shield trenches, such as illustrated in FIG. 1.

In this example, one or more of the termination shield trenches 110, 120 and 130 can include a poly (e.g., n-type poly) shield electrode (trench shield electrode) that is disposed on a dielectric layer that lines the trenches. Accordingly, the termination shield trenches 110, 120 and 130 can also be referred to as trench shield electrodes. Widths of the trench shield electrodes 110, 120 and 130 (and the corresponding mesas) can be measured along the line W in FIG. 1, where the line W is orthogonal to the longitudinal axis L.

In implementations, the trench shield electrodes 110, 120 and 130 can be coupled to a source potential for a corresponding power device (e.g., an n-type shielded gate MOSFET) that is implemented in the active region. Such a power device can include, for example, an n-channel shielded trench gate MOSFET having a source region, a body region (e.g., a p-well), a gate electrode, a drift region, a drain region, source metal, source contact, a heavy body region (e.g. contacted with the source metal), etc. For n-channel power MOSFET devices, the source potential can be electrical ground.

As illustrated in FIG. 1, the (standard) termination shield trenches 110 and 120 can each have a first portion in the active region and a second portion in the termination region. The second portion in the termination region can extend a distance D1 into the termination region from the active region. The (indented) termination trench 130 can also have a first portion in the active region and a second portion in the termination region. In the termination structure 100, the second portion of the (indented) termination shield trench 130 can extend a distance D2 into the termination region from the active region. The termination shield trench 130 can be referred to as being indented by a distance D3 (the difference between D1 and D2 in FIG. 1). The distances D1, D2 and D3 can vary depending on the particular embodiment. In certain implementations, D1 can be 1.5 times or more than a depth of a trench in which the shield electrodes 110, 120 and 130 are formed. In some implementations, the distance D3 (e.g., an indent distance) can be in a range of 0.2 microns (μm) to approximately equal to the distance D1 (e.g., the indent distance can correspond with the edge 105 of active area well region). As shown in FIG. 1, the indented trenches (e.g., termination shield trench 130) are interleaved between the standard termination shield trenches (e.g., trenches 110 and 120).

In the termination structure 100, a mesa 140 (e.g., a narrow mesa) is defined between the (standard) trench shield electrode 110 and the (indented) trench shield electrode 130. Likewise, a mesa 145 (e.g., a narrow mesa) is defined between the (standard) trench shield electrode 120 and the (indented) trench shield electrode 130. In power devices where the active and termination regions are disposed in a semiconductor region (an epitaxial layer) with a retrograde doping profile, the mesas 140 and 145 can have a large charge imbalance (e.g., an order of magnitude or more) between their upper surfaces and their bottoms (e.g., at a depth corresponding with a bottom of the trench shield electrodes 110, 120 and 130), which can cause undesirable breakdown processes to occur in the termination region.

However, as a result of the shield termination trench 130 being indented by the distance D3 in the termination structure 100, a mesa 150 (e.g., a wide mesa) is defined between the trench shield electrode 110 and the trench shield electrode 120, where the mesa 150 is fluidically associated with the mesas 140 and 145. The mesa 150 being fluidically associated with the mesas 140 and 145, in this example, can mean that a portion of the semiconductor region that defines the mesas 140, 145 and 150 is contiguous. Such fluidic association between the mesas 140, 145 and 150 allows for spreading of a depletion field from the mesas 140, 145 into the mesa 150. As shown in FIG. 1, the mesa 150 is wider along the line W (e.g., more than twice as wide) than each of the mesas 140 and 145. Mesa 140 and mesa 145 can have a same width. Wider mesas defined by indented trench shield electrodes, such as the mesa 150 (which spans or extends between non-adjacent standard trenches), when implemented alternatively as shown in FIG. 1, can improve charge balance (e.g., surface to bottom of mesas) of the termination structure 100. For instance, such wider mesas can provide more available charge near the surface in the termination region to support a depletion field and prevent breakdown processes from occurring in the termination region. Said another way, increased available surface charge from wider mesas defined by indented trench shield electrodes, such as the mesa 150, can increase a voltage (e.g., holding voltage) at which a depletion field of an associated power device would extend beyond the ends of the termination trenches 110 and 120 and cause a breakdown process to occur. This can, in turn, help increase a voltage at which breakdown occurs in the termination region for a given power device.

In certain implementations, such as those illustrated in at least FIG. 2 and FIGS. 7A-7D, in addition to indenting every other shield electrode trench (or termination portion thereof), such as the trench shield electrode 130 in FIG. 1, additional structures can be defined to improve charge balance in a termination region of a power semiconductor device. Such structures can include trench extensions (extension trenches) that are produced in wider mesas that are defined by the indented trench shield electrodes (e.g., the mesa 150 in FIG. 1). Such extension trenches can extend from respective ends of indented trench shield electrodes along the longitudinal axis L, which is shown in each of the drawings noted above.

Such additional structures can also include border trenches (perimeter trenches) that extend along an axis that is orthogonal to the longitudinal axis L (e.g., a longitudinal axis along the line W). Such border trenches can be spaced (isolated) from ends of standard trench shield electrodes. In some implementations, extension trenches, such as those described herein, can extend from a border trench to respective ends of indented trench shield electrodes, such as shown in, for example, FIGS. 2, 7B and 7D. In other words, in certain implementations, a given extension trench of a termination structure (in a termination region) can be fluidically associated with both a trench of an indented trench shield electrode, as well as a border trench. The extension trench and the border trench being fluidically associated with the trench of the indented trench shield electrode and the border trench, in this example, can mean that the trench of the indented trench shield electrode, the extension trench and the border trench are contiguous. The trench of the indented trench shield electrode, the extension trench and the border trench may each vary in width and/or depth (e.g., relative to each other).

Figure 2:
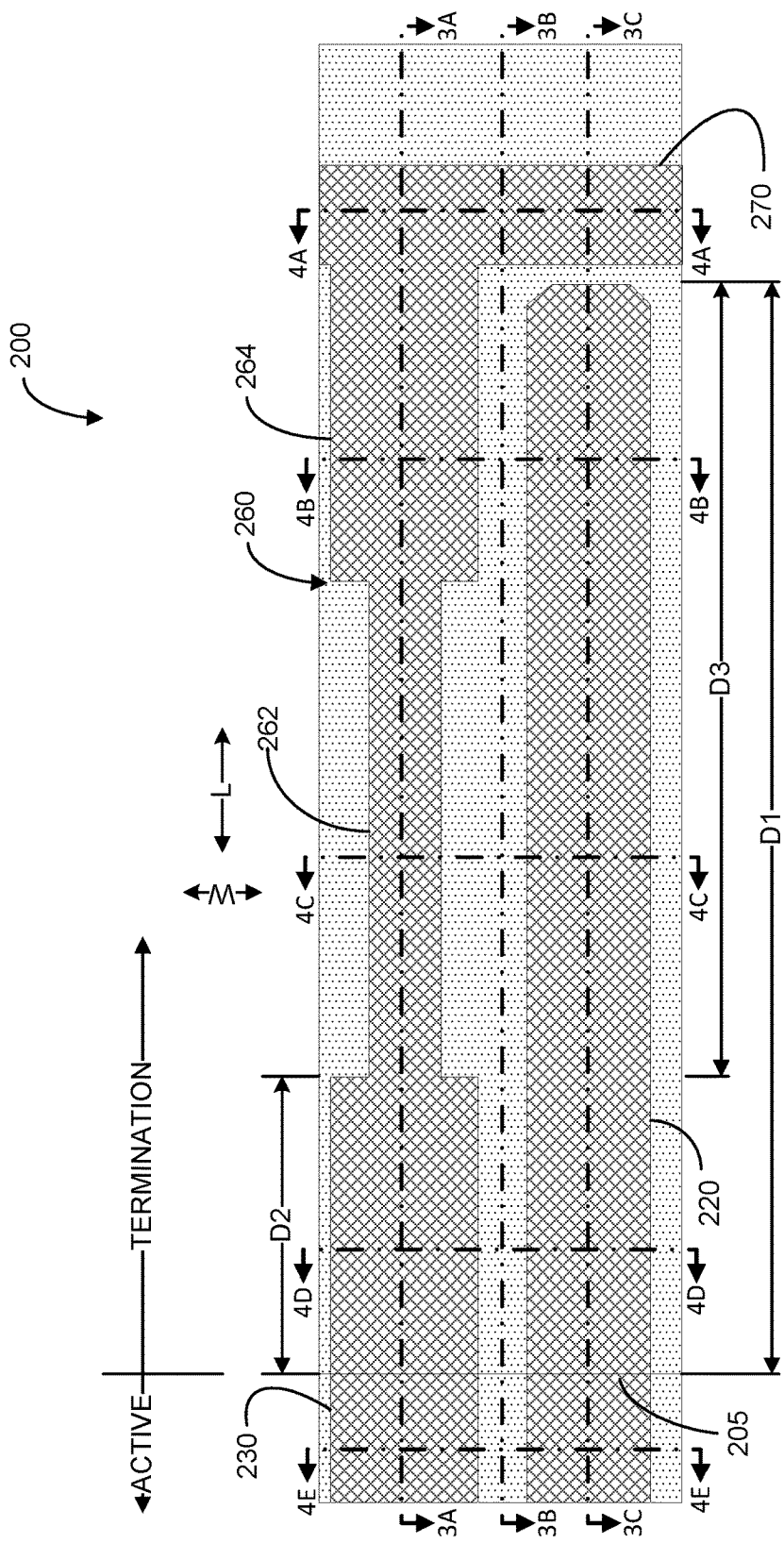
FIG. 2 is a diagram illustrating a plan view of another termination structure with indented shield electrodes that can be implemented in a power semiconductor device, according to an implementation.

FIG. 2 is a diagram illustrating a termination structure 200 for a power device that includes both an extension trench and a border trench, in accordance with an implementation. In implementations of termination regions for power semiconductor devices, the termination structure 200 of FIG. 2 can be replicated such that the structure, as shown in FIG. 2, repeats throughout an associated termination region.

In the termination structure 200, a boundary between an active region and a termination region can be defined by an edge 205 of a well region (e.g., a p-well that is disposed in the active region and defines a body region of a corresponding n-channel shielded trench gate MOSFET). The termination structure 200 shown in FIG. 2 includes a standard termination shield trench (trench shield electrode) 220, such as those described above with respect to FIG. 1. The trench shield electrode 220 can extend into the termination region from the active region by a distance D1 along the longitudinal axis L and can have a poly (n-type poly) shield electrode defined therein. The shield electrode can be disposed on a shield trench dielectric that lines the trench of the trench shield electrode 220. The shield electrode of the trench shield electrode 220 can be coupled to a source potential of a corresponding power device (e.g., an n-channel shielded trench gate MOSFET).

The termination structure 200 of FIG. 2 also includes an indented termination trench shield electrode 230 (e.g., an n-type poly electrode disposed on a shield dielectric layer) that extends a distance D2 along the longitudinal axis L (in parallel with the trench shield electrode 220) into the termination region from the active region. As shown in FIG. 2 the trench shield electrode 230 is indented from an end of the trench shield electrode 220 by a distance D3. The distances D1, D2 and D3 (as well as widths of the various elements of the termination structure 200 along the line W) can vary depending on the particular implementation.

The termination structure 200 also includes an extension trench 260 and a border trench 270. As discussed above, the extension trench 260 can extend between (and be fluidically associated/contiguous with) a trench of the indented trench shield electrode 230 (e.g., at an end of the indented trench shield electrode 230) and the border trench 270. As shown in FIG. 2, the extension trench can include a first portion 262 and a second portion 264. The first portion 262 of the extension trench can be dielectric filled (e.g., by a same dielectric semiconductor process used to form the shield dielectric for the trench shield electrodes 220 and 230). The second portion 264 of the extension trench 260 and the border trench 270 can each include a floating electrode (e.g., n-type poly), where the floating electrodes are disposed, at least in part, within a shield trench dielectric layer lining the second portion 264 of the extension trench 260 and the border trench 270, where the shield dielectric layer and the floating electrodes are produced using the same semiconductor processes that are used to produce the trench shield electrodes 220 and 230. In other implementations, the second portion 264 of the extension trench 260 and/or the border trench 270 can be dielectric filled.

As shown in FIG. 2, the first portion 262 of the extension trench 260 can be narrower than the trench shield electrode 230 and narrower than the second portion 264 of the extension trench. In some implementations, trenches for the trench shield electrodes 220 and 230, the extension trench 260 (both portions 262 and 264) and the border trench 270 can be formed using the same semiconductor processes. In such approaches, because the first portion 262 of the extension trench is narrower than the trench shield electrode 230 and narrower than the second portion 264 of the extension trench 260, depending on the particular etch process, the first portion 262 of the extension trench 260 can etch more slowly. This slower etch rate of the narrower trench will result in the first portion 262 of the extension trench being shallower along a vertical axis (in and out of the page) that is orthogonal to the longitudinal axis L and the line W than a trench of the trench shield electrode 230 and a trench of the second portion 264 of the extension trench 260, such as described further below. Also, due to the first portion 262 of the extension trench being narrower (e.g., as compared to the second portion 264), the first portion 262, in certain embodiments, may include a dielectric (oxide, etc.) disposed therein and exclude an electrode (grounded or floating). Such an approach can also provide electric isolation of an electrode disposed in the second portion 264 of the extension trench 260 from the trench shield electrode 230. As compared to the first portion 262 of the extension trench 260, trenches that are defined as being wider than the trenches shown in FIG. 2 (e.g., for features included in extensions trenches or border trenches, such as the second portion 264 of the extension trench 260) can etch more rapidly, resulting in trenches that would be deeper (along the vertical axis described above) than the trenches shown in FIG. 2.

In the above example, the oxide filled first portion 262 and the floating electrode second portion 264 of the extension trench 260 can improve charge balance by removing silicon charge, which, during depletion of a corresponding power device, can increase a potential of the depletion field that is sustained in the termination region (as compared to termination structures that include only standard termination trench electrodes of a same length). Simulation results illustrating depletion operation of the termination structure 200 are shown in FIGS. 5A-5C and 6A-6B and discussed further below.

FIGS. 3A-3C and 4A-4E are diagrams illustrating cross-sectional views of the termination structure of FIG. 2 along respective cut lines shown in FIG. 2. That is, the cross-sectional views of FIGS. 3A-3C correspond with section lines along the axis L in FIG. 2, while the cross-sectional views of FIGS. 4A-4E correspond with section lines along the axis W in FIG. 2.

Figure 3A:
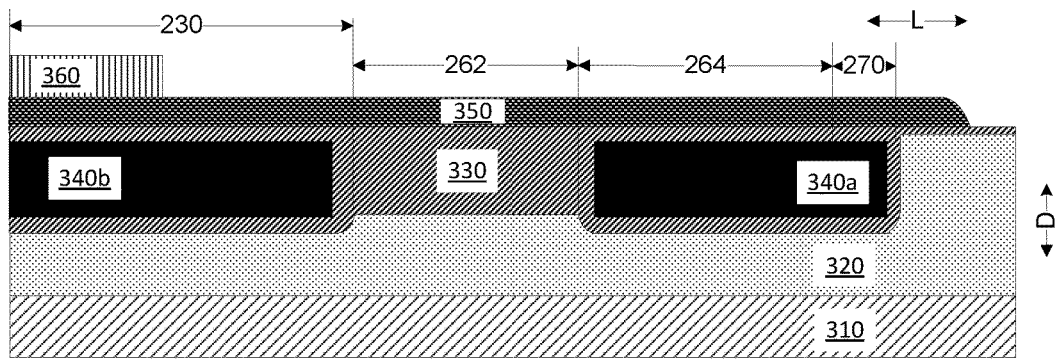
FIGS. 3A-3C are diagrams illustrating cross-sectional views of the termination structure of FIG. 2 along respective cut lines shown in FIG. 2.
Figure 3B:
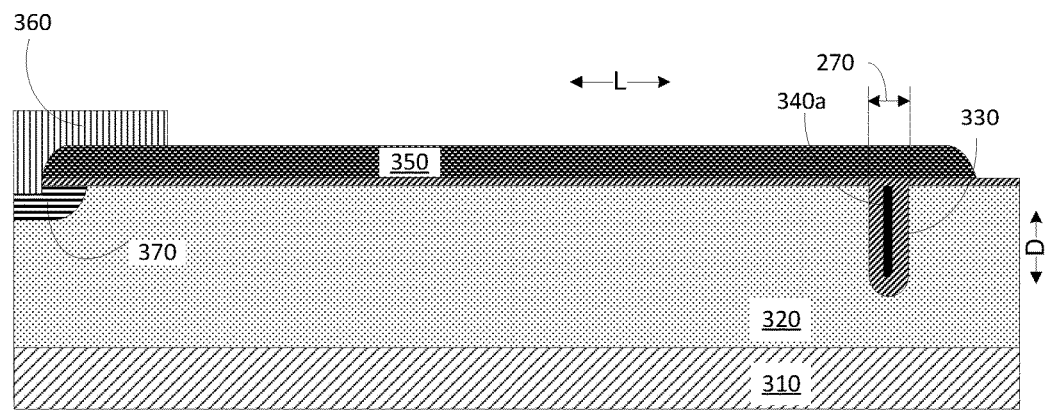
Figure 3C:
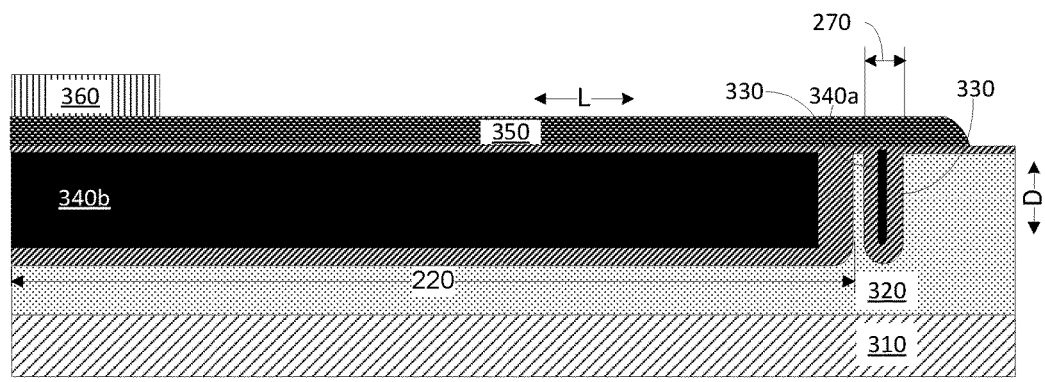

Specifically, for FIGS. 3A-3C, FIG. 3A is diagram illustrating a cross-sectional view of the termination structure 200 along section line 3A-3A in FIG. 2. FIG. 3B is diagram illustrating a cross-sectional view of the termination structure 200 along section line 3B-3B in FIG. 2. FIG. 3C is diagram illustrating a cross-sectional view of the termination structure 200 along section line 3C-3C in FIG. 2.

For each of the views shown in FIGS. 3A-3C and FIGS. 4A-4E, like elements are referenced with like references numbers. For instance, as shown in FIGS. 3A-3C and FIGS. 4A-4E, the termination structure 200 includes a back side contact (e.g. a metal, drain contact) layer 310 for the termination structure 200 and an associated power semiconductor device. The termination structure 200 also includes a semiconductor region 320 (e.g., an n-type epitaxial semiconductor layer and/or semiconductor substrate), in which the termination structure 200 (and associated power semiconductor device) can be formed, shield dielectric 330, an inter-layer dielectric (ILD) 350, and a source metal layer 360. The source metal layer 360 is, however, not shown in FIGS. 4A-4E and would be included, in this example, only in the cross-section of FIG. 4E (disposed on an upper surface of the ILD 350).

FIG. 3A illustrates (in cross-section) structure and relationships of the indented trench shield electrode 230, the extension trench 260 (e.g., the first portion 262 and the second portion 264) and the border trench 270. As shown in FIG. 3A, the indented trench shield electrode 230 can include a conductive shield electrode 340b that is disposed (at least in part) within the shield dielectric 330. In certain implementations, the conductive shield electrode 340b can be coupled to a source potential of an associated power semiconductor device (e.g., ground potential for an n-type metal-oxide semiconductor (NMOS) transistor). The first portion 262 of the extension trench can be filled (substantially filled) with the shield dielectric 330, and therefore floating. Further, the second portion 264 of the extension trench 264 and the border trench 270 (as further shown in FIG. 3B) can include a conductive termination electrode 340a that is either floating or tied to drain potential of an associated power semiconductor device (and electrically isolated from the conductive shield electrode 340b by the shield dielectric 330 of the first portion 262 of the extension trench 260).

As can be seen from a comparison of FIGS. 3A and 3B (with further reference to FIG. 2), the second portion 264 of extension trench 260 can be fluidically associated/contiguous with the border trench 270. For instance, the termination electrode 340a can be common (contiguous) between the second portion 264 of the extension trench 260 and the border trench 270, and disposed (at least in part) within the shield dielectric 330. As can also be seen in FIG. 3B, the source metal layer 360 contacts the active-area well layer 370 (e.g., a p-well layer in this example implementation) adjacent an end of the ILD layer 350.

FIG. 3C illustrates (in cross-section) structure of the trench shield electrode 220 (e.g., a non-indented trench shield electrode). As shown in FIG. 3C, the trench shield electrode 220 can include a conductive shield electrode 340b that is disposed (at least in part) within the shield dielectric 330. The conductive shield electrode 340b can be coupled to a source potential of an associated power semiconductor device (e.g., ground potential for an n-type metal-oxide semiconductor (NMOS) transistor). The trench shield electrode 220 can be (electrically and/or physically) isolated (by a portion of the semiconductor region 320 and/or the shield dielectric 330) from the border trench 270.

FIG. 4A is diagram illustrating a cross-sectional view of the termination structure 200 along section line 4A-4A in FIG. 2. FIG. 4B is diagram illustrating a cross-sectional view of the termination structure 200 along section line 4B-4B in FIG. 2. FIG. 4C is diagram illustrating a cross-sectional view of the termination structure 200 along section line 4C-4C in FIG. 2. FIG. 4D is diagram illustrating a cross-sectional view of the termination structure 200 along section line 4D-4D in FIG. 2. FIG. 4E is diagram illustrating a cross-sectional view of the termination structure 200 along section line 4E-4E in FIG. 2.

In FIG. 4A, a cross-section through the border trench 270 is shown. As illustrated in FIG. 4A, the border trench 270 can include a conductive trench electrode (e.g., a doped polysilicon electrode) 340a that is disposed (at least in part) within the shield dielectric 330. In FIG. 4B, a cross-section through the termination shield electrode 220 and the second portion 264 of the extension trench 260 is shown. As illustrated, the termination shield electrode 220 includes the conductive shield electrode (e.g., a doped polysilicon electrode) 340b that is disposed (at least in part) within the shield dielectric 330. As also shown in FIG. 4B, the second portion 264 of the extension trench 260 includes the termination electrode 340a that is disposed (at least in part) within the shield dielectric 330.

In FIG. 4C, a cross-section through the termination shield electrode 220 and the first portion 262 of the extension trench 260 is shown. As illustrated, as with FIG. 4B, the termination shield electrode 220 includes the conductive shield electrode (e.g., a doped polysilicon electrode) 340b that is disposed (at least in part) within the shield dielectric 330. As also shown in FIG. 4C, the second portion 262 of the extension trench 260 includes a trench that is filled (substantially filled) with the shield dielectric 330. As illustrated in FIG. 4C, the first portion 262 of the extension trench 260 (e.g. because it is defined, using photolithography, as being narrower than the second portion 264) is narrower and shallower than the second portion 264 of the extension trench 260 (as well as narrower and shallower than the trench shield electrode 220 and the indented trench shield electrode 230).

In FIG. 4D, a cross-section through the termination shield electrode 220 and the indented shield electrode 230 is shown. As illustrated, as with FIGS. 4B and 4C, the termination shield electrode 220 includes the conductive shield electrode 340b that is disposed (at least in part) within the shield dielectric 330. As also shown in FIG. 4D, the indented shield electrode 230 includes the shield electrode 340b (e.g., a doped polysilicon electrode) that is disposed (at least in part) within the shield dielectric 330.

In FIG. 4E, a cross-section through the termination shield electrode 220, the indented shield electrode 230 and the well 370 is shown. As illustrated, as with FIGS. 4B-4D, the termination shield electrode 220 includes the conductive shield electrode 340b that is disposed (at least in part) within the shield dielectric 330. As also shown in FIG. 4D, the indented shield electrode 230 includes the shield electrode 340b (e.g., a doped polysilicon electrode) that is disposed (at least in part) within the shield dielectric 330. The well 370 is disposed between the termination shield electrode 220 and the indented shield electrode 230 and can be contacted by the source metal layer 360 as illustrated in FIG. 3B. As noted above, the source metal 360 is not shown in FIG. 4E, but would be disposed on an upper surface of the ILD 350 in this example.

FIGS. 5A-5C are diagrams illustrating simulation results for the termination structure illustrated in FIG. 2. FIGS. 5A and 5B show, along the axis L, example dimensions, which can be in microns for certain implementations. For some implementations, the dimensions shown in FIGS. 5A and 5B can be normalized dimensions.

FIG. 5A is a diagram illustrating a sectional portion of the termination structure 200 of FIG. 2. Like reference numbers, as those used in FIG. 2, are used in FIG. 5A to indicate the various portions of the termination structure 200 shown. FIG. 5B is a schematic view of the surface of the sectional view of the termination structure 200 shown in FIG. 5A. FIG. 5B also includes contour curves 510 illustrating surface potential simulation results during depletion of a power semiconductor device including the termination structure 200. In this example, the spacing between the contour curves 510 in FIG. 5B corresponds with approximately 5 volts (V) of potential difference.

The contour curves (potential contours) 510 in FIG. 5B also correspond with a graph of surface potential along the termination structure 200 shown in FIG. 5C (i.e., surface potential along the section line 3B-3B in FIG. 2), where the surface potential is represented by the line 520. In other words, the graph of FIG. 5C illustrates a voltage potential distribution along a cutline in a center of a semiconductor mesa (i.e., along the section line 3B-3B in FIG. 2). As shown by the line 520, in this example, ~35 V of potential is sustained within the mesa along the first portion 262 of the extension trench 260. This voltage potential is sustained due, at least in part, to extra available charge associated with first portion 262 and the second portion 264 of the extension trench 260 trench, rather than the depletion potential concentrating at the end of the termination trench 220 (at or near the border trench 270 in termination structures without indented shield electrodes and/or such extension trenches). Accordingly, indented termination trench structures, such as the structure shown in FIG. 2 and those described herein, can increase a depletion breakdown voltage of a termination structure by providing extra available charge as compared to termination structures without such indented trench structures.

Figure 6:
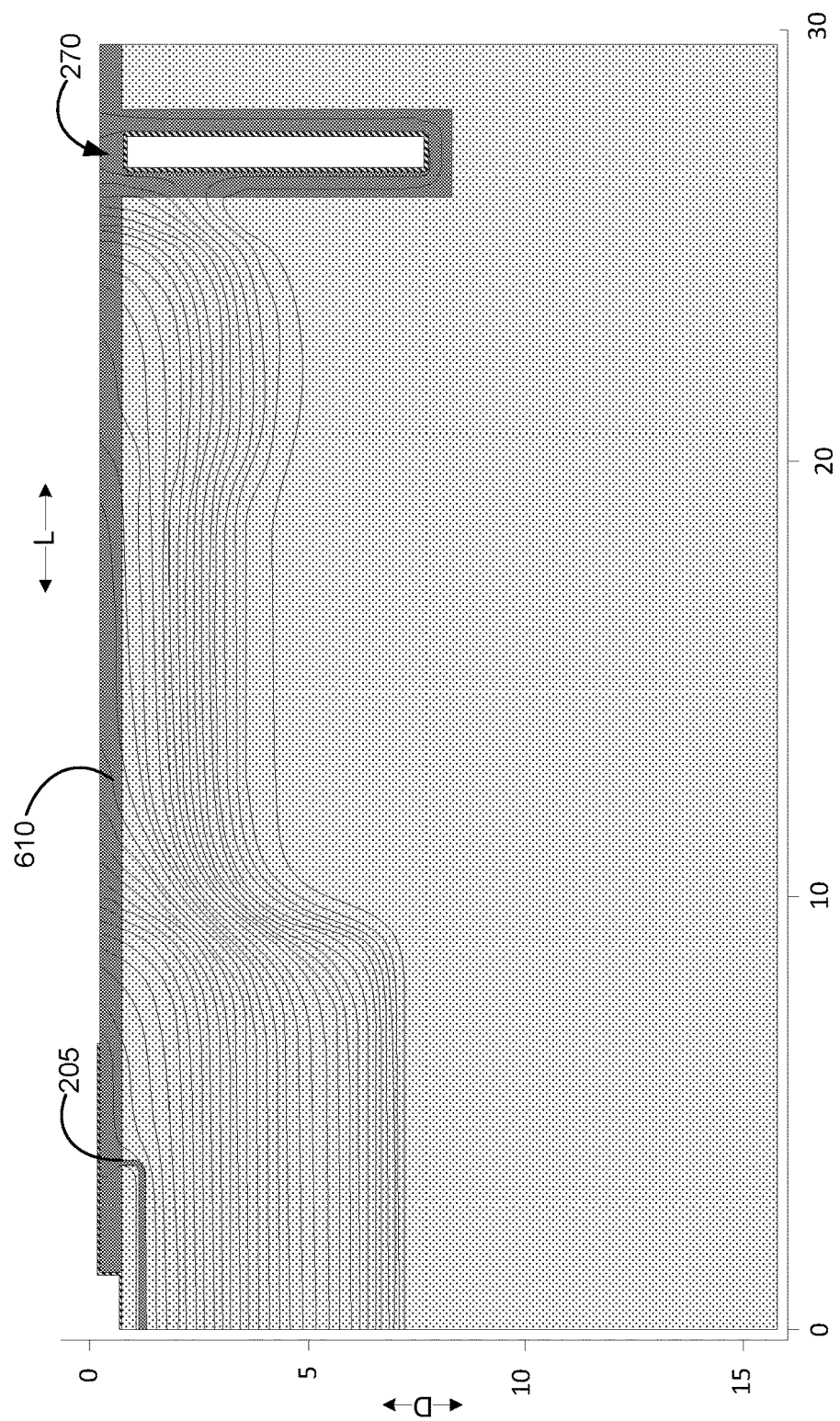
FIG. 6 is a diagram illustrating simulation results showing potential contours for a cross-section of the termination structure of FIG. 2.

FIG. 6 is a diagram illustrating a schematic, cross-sectional view of the termination structure 200 along section line 3B-3B that includes potential contours illustrating potential contours corresponding with the termination structure 200 of FIG. 2 (i.e., along the section line 3B-3B) and, therefore, also corresponds with FIGS. 5A-5C. Similarly to FIGS. 5A and 5B, FIG. 6 show, along the axis L and the axis D, example dimensions, which can be in microns for certain implementations. For some implementations, the dimensions shown in FIG. 6 can be normalized dimensions.

In the example shown in FIG. 6 (which corresponds with the termination structure 200), as with the contour curves 510 in FIG. 5B, the spacing between the contour curves 610 in FIG. 6 corresponds with approximately 5 volts (V) of potential difference. The contours 610 shown in FIG. 6 illustrate that the electrostatic potential is distributed (e.g., evenly distributed, substantially evenly distributed, etc.) over the cross-section of the termination structure 200 shown in FIG. 6, rather than being concentrated at the border trench 270, where such concentration can cause voltage breakdown (e.g., in the termination region) below a desired voltage level (e.g., at a depletion voltage below a desired operating voltage of an associated power semiconductor device).

FIGS. 7A-7D are diagrams illustrating termination structures, respectively, 700a, 700b, 700c and 700d, according to various implementations. The termination structures of FIGS. 7A-7D each include alternating indented trench shield electrodes (e.g., every other shield electrode). The termination structures of FIGS. 7A-7D include various extension trench configurations. As with the example termination structures discussed above, the termination structures shown in FIGS. 7A-7B can be replicated to produce a termination region for a power semiconductor device that surrounds, partially surrounds, borders, etc. a corresponding active region in which an active device (e.g., a shielded trench gate MOSFET) is implemented.

In the termination structures of FIGS. 7A-7D, the various portions of the extension trenches, as well as the border trenches can be dielectric filled trenches (e.g., shield dielectric filled, oxide filled, etc.) or include floating conductive (e.g., n-type poly) electrodes that are disposed on a shield dielectric lining the respective trench and electrically floating. Respective active regions and termination regions are also indicated in FIGS. 7A-7D, where respective well edges 705a, 705b, 705c and 705d define boundaries between the respective active regions and termination regions. For orientation reference, and correspondence to the other examples described herein, the longitudinal axis L and the line W are shown in each of FIGS. 7A-7D. As with the extension trench 260 and the border trench 270 of the termination structure 200 of FIG. 2, the extension trenches and/or border trenches of FIGS. 7A-7D can remove silicon charge in the respective termination regions and, as result, balance charge in mesas in the termination regions of the termination structures 700a, 700b, 700c and 700d. The lengths, widths and spacings between the elements of the terminations structures 700a, 700b, 700c and 700d are shown by way of example and for purposes of illustration. These lengths, widths and spacings can vary depending on the implementation.

As shown in FIG. 7A, the termination structure 700a includes a plurality of standard trench shield electrodes, including trench shield electrodes 710a and 720a, that extend between the active region and the termination region. The termination structure 700a also includes a plurality of indented trench shield electrodes, including trench shield electrode 730a. The trench shield electrodes 710a, 720a and 730a can each include a conductive (e.g., n-poly) electrode that is disposed on a shield dielectric layer and coupled with a source potential of a corresponding active power device that is implemented in the active region.

The termination structure 700a shown in FIG. 7A also includes an extension trench 760a that extends, along the longitudinal axis L, from an end of the indented trench shield electrode 730a. As shown in FIG. 7A, the termination structure 700a can also include additional extension trenches that extend from respective ends of other indented trench shield electrodes. The extension trench 760a, which can be dielectric filled, can be narrower (along the line W) and shallower (along a vertical axis in and out of the page) than respective trenches of the trench shield electrodes 710a, 720a and 730a.

As shown in FIG. 7B, the termination structure 700b includes a plurality of standard trench shield electrodes, including trench shield electrodes 710b and 720b, that extend between the active region and the termination region. The termination structure 700b also includes a plurality of indented trench shield electrodes, including trench shield electrode 730b. The trench shield electrodes 710a, 720a and 730a can each include a conductive (e.g., n-poly) electrode that is disposed on a shield dielectric layer and coupled with a source potential of a corresponding active power device that is implemented in the active region.

The termination structure 700b shown in FIG. 7B also includes two extension trenches 760b1 and 760b2 that extend, along the longitudinal axis L, from an end of the indented trench shield electrode 730b. As shown in FIG. 7B, the termination structure 700b can also include additional extension trenches that extend from respective ends of other indented trench shield electrodes. The extension trenches 760b1 and 760b2, which can be dielectric filled, can be narrower (along the line W) and, due to etch processing attributes, shallower (along a vertical axis in and out of the page) than respective trenches of the trench shield electrodes 710b, 720b, and 730b.

The termination structure 700b can also include a border trench 770b. The border trench 770b can include a floating conductive (e.g., n-type poly) electrode that is deposited on a shield dielectric layer disposed in the border trench 770b. As shown in FIG. 7B, the extension trenches 760b1 and 760b2 can extend from an end of the indented trench shield electrode 730b to the border trench 770b (e.g., the extension trenches 760b1 and 760b2 can be fluidically associated/contiguous with a trench the indented trench shield electrode 730b and the border trench 770b). In other implementations, the border trench 770b can be dielectric filled.

Figures 7C, 7D:
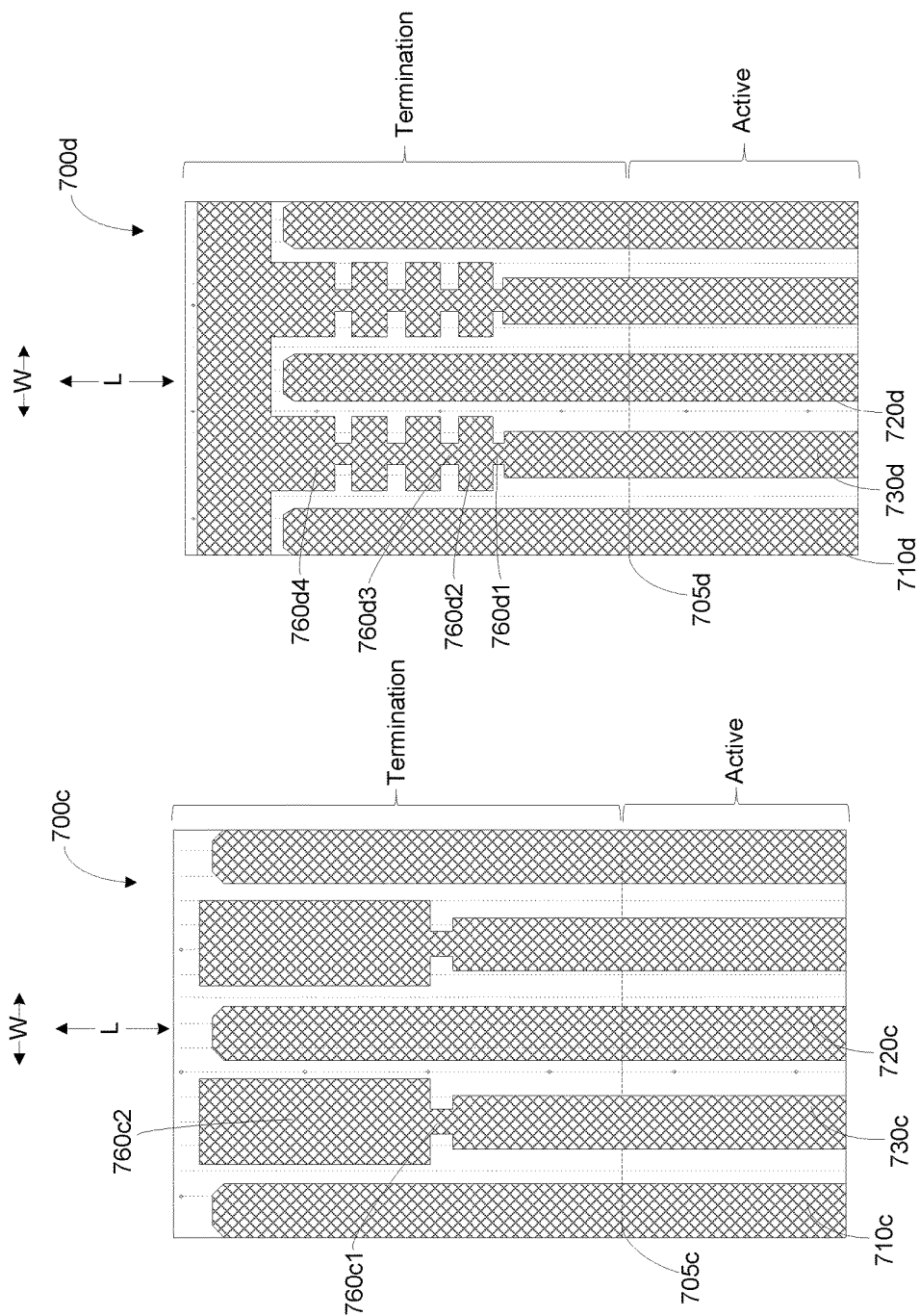

As shown in FIG. 7C, the termination structure 700c includes a plurality of standard trench shield electrodes, including trench shield electrodes 710c and 720c, that extend between the active region and the termination region. The termination structure 700c also includes a plurality of indented trench shield electrodes, including trench shield electrode 730c. The trench shield electrodes 710c, 720c and 730c can each include a conductive (e.g., n-poly) electrode that is disposed on a shield dielectric layer and coupled with a source potential of a corresponding active power device that is implemented in the active region.

The termination structure 700c shown in FIG. 7C can also include an extension trench that extends, along the longitudinal axis L, from an end of the indented trench shield electrode 730a. As shown in FIG. 7C, the termination structure 700c can also include additional extension trenches that extend from respective ends of other indented trench shield electrodes. The extension trench of the termination structure 700c can include a first portion 760c1 and a second portion 760c2. The first portion 760c1 of the extension trench in FIG. 7C can be dielectric filled, and can be narrower (along the line W) and, as a result of etch processing attributes, shallower (along a vertical axis in and out of the page) than respective trenches of the trench shield electrodes 710c, 720c and 730c. The second portion 760c2 of the extension trench in FIG. 7C include a floating conductive (e.g., n-type poly) electrode that is disposed on a shield dielectric layer disposed in a trench of the second portion 760c2 of the extension trench of the termination structure 700c. Further, the second portion 760c2 of the extension trench in FIG. 7C, can be wider (along the line W) and, therefore, as result of etch processing attributes, deeper (along a vertical axis in an out of the page) than respective trenches of the trench shield electrodes 710c, 720c and 730c. In other implementations, the second portion 760c2 of the extension trench in FIG. 7C can be dielectric filled.

As shown in FIG. 7D, the termination structure 700d can include a plurality of standard trench shield electrodes, including trench shield electrodes 710b and 720b, that extend between the active region and the termination region. The termination structure 700d can also include a plurality of indented trench shield electrodes, including trench shield electrode 730d. The trench shield electrodes 710d, 720d and 730d can each include a conductive (e.g., n-poly) electrode that is disposed on a shield dielectric layer and coupled with a source potential of a corresponding active power device that is implemented in the active region.

The termination structure 700d shown in FIG. 7B also includes an extension trench that includes multiple extension trench portions 760d1, 760d2, 760d3 and 760d4, where the extension trench extends, along the longitudinal axis L, from an end of the indented trench shield electrode 730d. As shown in FIG. 7D, the termination structure 700d can also include additional extension trenches (having multiple portions) that extend from respective ends of other indented trench shield electrodes. The portion 760d1 of the extension trenches in FIG. 7D can be dielectric filled and can be narrower (along the line W) and, as a result of etch processing attributes, shallower (along a vertical axis in and out of the page) than respective trenches of the trench shield electrodes 710d, 720d and 730d.

The portions 760d2, 760d3 and 760d4 of the extension trench in FIG. 7D (and similar portions of the extension trench that are not specifically referenced) can include a floating conductive (e.g., n-type poly) electrode that is disposed on a shield dielectric layer disposed in respective trenches of the portions 760d2, 760d3 and 760d4. The portion 760d3 of the extension trench in FIG. 7D (and similar portions of the extension trench that are not specifically referenced) can be narrower (along the line W) and, as a result of etch processing attributes, shallower (along a vertical axis in and out of the page) than respective trenches of the trench shield electrodes 710d, 720d and 730d. Further, the portions 760d2 and 760d4 of the extension trench in FIG. 7D (and similar portions of the extension trench that are not specifically referenced) can be wider (along the line W) and, as result of etch processing attributes, deeper (along a vertical axis in and out of the page) than respective trenches of the trench shield electrodes 710d, 720d and 730d. In other implementations, the portions 760d2, 760d3 and 760d4 of the extension trench in FIG. 7D (and similar portions of the extension trench that are not specifically referenced in FIG. 7D) can be dielectric filled.

The termination structure 700d can also include a border trench 770d. The border trench 770d can include a floating conductive (e.g., n-type poly) electrode that is deposited on a shield dielectric layer disposed in the border trench 770d. As shown in FIG. 7D, the extension trench of the termination structure 700d can extend from an end of the indented trench shield electrode 730d to the border trench 770d (e.g., the extension trench can be fluidically associated/contiguous with a trench of the indented trench shield electrode 730b and the border trench 770b). In other implementations, the border trench 770d can be dielectric filled. Implementations, border trenches can be included in other termination structures described herein, such as the termination structures 100, 700a and 700c.

In a first example, a power semiconductor device can include a semiconductor region having an active region and a termination region; a first trench shield electrode defined in the semiconductor region, the first trench shield electrode extending along a longitudinal axis, the first trench shield electrode having a first portion disposed in the active region and a second portion disposed in the termination region, the second portion of the first trench shield electrode extending, along the longitudinal axis, a first distance into the termination region from the active region; a second trench shield electrode defined in the semiconductor region, the second trench shield electrode extending along the longitudinal axis in parallel with the first trench shield electrode, the second trench shield electrode having a first portion disposed in the active region and a second portion disposed in the termination region, the second portion of the second trench shield electrode extending, along the longitudinal axis, the first distance into the termination region from the active region; and a third trench shield electrode defined in the semiconductor region between the first trench shield electrode and the second trench shield electrode, the third trench shield electrode extending along the longitudinal axis in parallel with the first trench shield electrode and the second trench shield electrode, the third trench shield electrode having a first portion disposed in the active region and a second portion disposed in the termination region, the second portion of the third trench shield electrode extending, along the longitudinal axis, a second distance into the termination region from the active region, the second distance being less than the first distance.

In a second example based on the first example, the power semiconductor device can further include an extension trench that extends along the longitudinal axis, the extension trench can be disposed in the termination region between the first trench shield electrode and the second trench shield electrode, the extension trench can extend from an end of the third trench shield electrode, the extension trench having a dielectric disposed therein.

In a third example based on the second example, the extension trench can be a first extension trench, the power semiconductor device can further include a second extension trench that extends along the longitudinal axis in parallel with the first extension trench between the first trench shield electrode and the second trench shield electrode, the second extension trench can extend from the end of the third trench shield electrode, the second extension trench can have a dielectric disposed therein.

In a fourth example based on any one of the second example and the third example, the extension trench can have a width, along a horizontal axis that is orthogonal to the longitudinal axis, that is less than a width of the third trench shield electrode along the horizontal axis; and a depth, along a vertical axis that is orthogonal to the longitudinal axis and the horizontal axis, that is less than a depth of the third trench shield electrode along the vertical axis.

In a fifth example based on the first example, the power semiconductor device can further include an extension trench including a first extension trench portion that extends along the longitudinal axis, the first extension trench portion being disposed in the termination region between the first trench shield electrode and the second trench shield electrode, the first extension trench portion extending from an end of the third trench shield electrode, the first extension trench portion having a dielectric disposed therein; and a second extension trench portion that extends along the longitudinal axis, the second extension trench portion being disposed in the termination region between the first trench shield electrode and the second trench shield electrode, the second extension trench portion extending from an end of the first extension trench portion, the second extension trench portion being dielectric filled or having a floating conductive electrode disposed therein.

In a sixth example based on the fifth example, the first extension trench portion can have: a width, along a horizontal axis that is orthogonal to the longitudinal axis, that is less than a width of the third trench shield electrode along the horizontal axis; and a depth, along a vertical axis that is orthogonal to the longitudinal axis and the horizontal axis, that is less than a depth of the third trench shield electrode along the vertical axis; and the second extension trench portion can have: a width, along the horizontal axis, that is greater than the width of the third trench shield electrode along the horizontal axis; and a depth, along the vertical axis, that is greater than a depth of the third trench shield electrode along the vertical axis.

In a sixth example based on the fifth example, the extension trench can further include: a third extension trench portion that extends along the longitudinal axis, the third extension trench portion being disposed in the termination region between the first trench shield electrode and the second trench shield electrode, the third extension trench portion extending from an end of the second extension trench portion, the third extension trench portion being dielectric filled or having a floating conductive electrode disposed therein; and a fourth extension trench portion that extends along the longitudinal axis, the fourth extension trench portion being disposed in the termination region between the first trench shield electrode and the second trench shield electrode, the fourth extension trench portion extending from an end of the third extension trench portion, the fourth extension trench portion being dielectric filled or having a floating conductive electrode disposed therein.

In a seventh example based on any one of the fifth example and the sixth example, the third extension trench portion can have: a width, along a horizontal axis that is orthogonal to the longitudinal axis, that is less than a width of the third trench shield electrode along the horizontal axis; and a depth, along a vertical axis that is orthogonal to the longitudinal axis and the horizontal axis, that is less than a depth of the third trench shield electrode along the vertical axis; and the fourth extension trench portion can have a width, along the horizontal axis, that is greater than the width of the third trench shield electrode along the horizontal axis; and a depth, along the vertical axis, that is greater than a depth of the third trench shield electrode along the vertical axis.

In an eighth example based on the seventh example, the first trench shield electrode, the second trench shield electrode and the third trench shield electrode can each include a conductive electrode disposed on a dielectric layer, the dielectric layer insulating the conductive electrode from the semiconductor region, the conductive electrode being electrically coupled to a source potential of the power semiconductor device.

In a ninth example based on any one of the previous examples, the semiconductor region can include an epitaxial layer having a graded doping concentration that increases, from an upper surface of the epitaxial layer, over a depth of the epitaxial layer.

In a tenth example based on any one of the previous examples, the power semiconductor device can further include a trench-gate metal-oxide field-effect transistor (MOSFET) disposed in the active region.

In an eleventh example based on any one of the previous examples, the longitudinal axis can be a first longitudinal axis, the power semiconductor device can further include a border trench disposed in the termination region, the border trench extending along a second longitudinal axis that is orthogonal to the first longitudinal axis, the border trench being fluidically associated with an extension trench extending between the third trench shield electrode and the border trench, the border trench being isolated from the first trench shield electrode and the second trench shield electrode by respective mesas defined in the semiconductor region, the border trench being dielectric filled or having a floating conductive electrode disposed therein.

In a thirteenth example based on the twelfth example, the extension trench can include a first portion and a second portion, the first portion being dielectric filled and the second portion can have a floating conductive electrode disposed therein.

In a fourteenth example, a power semiconductor device can include: a semiconductor region having an active region and a termination region; a first trench shield electrode defined in the semiconductor region, the first trench shield electrode extending along a longitudinal axis, the first trench shield electrode having a first portion disposed in the active region and a second portion disposed in the termination region; a second trench shield electrode defined in the semiconductor region, the second trench shield electrode extending in parallel with the first trench shield electrode, the second trench shield electrode having a first portion disposed in the active region and a second portion disposed in the termination region; a third trench shield electrode defined in the semiconductor region between the first trench shield electrode and the second trench shield electrode, the third trench shield electrode extending in parallel with the first trench shield electrode and the second trench shield electrode, the third trench shield electrode having a first portion disposed in the active region and a second portion disposed in the termination region; a first mesa defined in the semiconductor region, the first mesa being disposed between a trench of the first trench shield electrode and a trench of the third trench shield electrode; a second mesa defined in the semiconductor region, the second mesa being disposed between the second trench shield electrode and the third trench shield electrode, the first mesa and the second mesa having a first width along a surface of the semiconductor region; a third mesa defined in the semiconductor region, the third mesa being disposed between the first trench shield electrode and the second trench shield electrode, the third mesa having a second width along the surface of the semiconductor region, the second width being greater than the first width.

In a fifteenth example based on the fourteenth example, the third mesa can be fluidically associated with the first mesa and the second mesa.

In a sixteenth example based on any one of fourteenth example and the fifteenth example, the semiconductor region can include an epitaxial layer having a graded doping concentration that increases, from an upper surface of the epitaxial layer, over a depth of the epitaxial layer.

In a seventeenth example based on any one of the fourteenth through sixteenth examples, the first trench shield electrode, the second trench shield electrode and the third trench shield electrode each can include a conductive electrode disposed on a dielectric layer, the dielectric layer insulating the conductive electrode from the semiconductor region, the conductive electrode being electrically coupled to a source potential of the power semiconductor device.

In an eighteenth example based on any one of the fourteenth through seventeenth examples, the power semiconductor device can further include a trench-gate metal-oxide field-effect transistor (MOSFET) disposed in the active region.

In a nineteenth example based on any one of the fourteenth through eighteenth examples, the longitudinal axis can be a first longitudinal axis, the power semiconductor device can further include a border trench disposed in the termination region, the border trench extending along a second longitudinal axis that is orthogonal to the first longitudinal axis.

It will be understood that, in the foregoing description, when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, adjacent to and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to, vertically adjacent to or horizontally adjacent to.

The various apparatus and techniques described herein may be implemented using various semiconductor processing and/or packaging techniques. Some embodiments may be implemented using various types of semiconductor processing techniques associated with semiconductor substrates including, but not limited to, for example, Silicon (Si), Galium Arsenide (GaAs), Silicon Carbide (SiC), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. A power semiconductor device comprising:
   a semiconductor region having an active region and a termination region;
   a first trench shield electrode defined in the semiconductor region, the first trench shield electrode extending along a longitudinal axis, the first trench shield electrode having a first portion disposed in the active region and a second portion disposed in the termination region, the second portion of the first trench shield electrode extending, along the longitudinal axis, a first distance into the termination region from the active region;
   a second trench shield electrode defined in the semiconductor region, the second trench shield electrode extending along the longitudinal axis in parallel with the first trench shield electrode, the second trench shield electrode having a first portion disposed in the active region and a second portion disposed in the termination region, the second portion of the second trench shield electrode extending, along the longitudinal axis, the first distance into the termination region from the active region; and
   a third trench shield electrode defined in the semiconductor region between the first trench shield electrode and the second trench shield electrode, the third trench shield electrode extending along the longitudinal axis in parallel with the first trench shield electrode and the second trench shield electrode, the third trench shield electrode having a first portion disposed in the active region and a second portion disposed in the termination region, the second portion of the third trench shield electrode extending, along the longitudinal axis, a second distance into the termination region from the active region, the second distance being less than the first distance.

2. The power semiconductor device of claim 1, further comprising an extension trench that extends along the longitudinal axis, the extension trench being disposed in the termination region between the first trench shield electrode and the second trench shield electrode, the extension trench extending from an end of the third trench shield electrode, the extension trench having a dielectric disposed therein.

3. The power semiconductor device of claim 2, wherein the extension trench is a first extension trench, the power semiconductor device further comprising a second extension trench that extends along the longitudinal axis in parallel with the first extension trench between the first trench shield electrode and the second trench shield electrode, the second extension trench extending from the end of the third trench shield electrode, the second extension trench having a dielectric disposed therein.

4. The power semiconductor device of claim 2, wherein the extension trench has:
   a width, along a horizontal axis that is orthogonal to the longitudinal axis, that is less than a width of the third trench shield electrode along the horizontal axis; and
   a depth, along a vertical axis that is orthogonal to the longitudinal axis and the horizontal axis, that is less than a depth of the third trench shield electrode along the vertical axis.

5. The power semiconductor device of claim 1, further comprising an extension trench including:
   a first extension trench portion that extends along the longitudinal axis, the first extension trench portion being disposed in the termination region between the first trench shield electrode and the second trench shield electrode, the first extension trench portion extending from an end of the third trench shield electrode, the first extension trench portion having a dielectric disposed therein; and
   a second extension trench portion that extends along the longitudinal axis, the second extension trench portion being disposed in the termination region between the first trench shield electrode and the second trench shield electrode, the second extension trench portion extending from an end of the first extension trench portion, the second extension trench portion being dielectric filled or having a floating conductive electrode disposed therein.

6. The power semiconductor device of claim 5, wherein:
   the first extension trench portion has:
      a width, along a horizontal axis that is orthogonal to the longitudinal axis, that is less than a width of the third trench shield electrode along the horizontal axis; and
      a depth, along a vertical axis that is orthogonal to the longitudinal axis and the horizontal axis, that is less than a depth of the third trench shield electrode along the vertical axis; and
   the second extension trench portion has:
      a width, along the horizontal axis, that is greater than the width of the third trench shield electrode along the horizontal axis; and
      a depth, along the vertical axis, that is greater than a depth of the third trench shield electrode along the vertical axis.

7. The power semiconductor device of claim 5, wherein the extension trench further includes:
   a third extension trench portion that extends along the longitudinal axis, the third extension trench portion being disposed in the termination region between the first trench shield electrode and the second trench shield electrode, the third extension trench portion extending from an end of the second extension trench portion, the third extension trench portion being dielectric filled or having a floating conductive electrode disposed therein; and
   a fourth extension trench portion that extends along the longitudinal axis, the fourth extension trench portion being disposed in the termination region between the first trench shield electrode and the second trench shield electrode, the fourth extension trench portion extending from an end of the third extension trench portion, the fourth extension trench portion being dielectric filled or having a floating conductive electrode disposed therein.

8. The power semiconductor device of claim 7, wherein:
   the third extension trench portion has:
      a width, along a horizontal axis that is orthogonal to the longitudinal axis, that is less than a width of the third trench shield electrode along the horizontal axis; and a depth, along a vertical axis that is orthogonal to the longitudinal axis and the horizontal axis, that is less than a depth of the third trench shield electrode along the vertical axis; and the fourth extension trench portion has:
a width, along the horizontal axis, that is greater than the width of the third trench shield electrode along the horizontal axis; and
a depth, along the vertical axis, that is greater than a depth of the third trench shield electrode along the vertical axis.

9. The power semiconductor device of claim 1, wherein the first trench shield electrode, the second trench shield electrode and the third trench shield electrode each includes a conductive electrode disposed on a dielectric layer, the dielectric layer insulating the conductive electrode from the semiconductor region, the conductive electrode being electrically coupled to a source potential of the power semiconductor device.

10. The power semiconductor device of claim 1, wherein the semiconductor region includes an epitaxial layer having a graded doping concentration that increases, from an upper surface of the epitaxial layer, over a depth of the epitaxial layer.

11. The power semiconductor device of claim 1, further comprising a trench-gate metal-oxide field-effect transistor (MOSFET) disposed in the active region.

12. The power semiconductor device of claim 1, wherein the longitudinal axis is a first longitudinal axis, the power semiconductor device further comprising a border trench disposed in the termination region, the border trench extending along a second longitudinal axis that is orthogonal to the first longitudinal axis, the border trench being fluidically associated with an extension trench extending between the third trench shield electrode and the border trench, the border trench being isolated from the first trench shield electrode and the second trench shield electrode by respective mesas defined in the semiconductor region, the border trench being dielectric filled or having a floating conductive electrode disposed therein.

13. The power semiconductor device of claim 12, wherein the extension trench includes a first portion and a second portion, the first portion being dielectric filled and the second portion having a floating conductive electrode disposed therein.

* * * * *